(12) United States Patent
Gipson et al.

(10) Patent No.: US 10,709,015 B1
(45) Date of Patent: Jul. 7, 2020

(54) STRUCTURAL SUPPORT ELEMENTS OF LIGHT GUIDE AND ELECTRICAL HOUSING

(71) Applicant: Dura Operating, LLC, Auburn Hills, MI (US)

(72) Inventors: Ron G. Gipson, Metamora, MI (US); Bhanumurthy Veeragandham, Auburn Hills, MI (US); Indraneel Page, Farmington Hills, MI (US)

(73) Assignee: DURA OPERATING, LLC, Auburn Hills, MI (US)

( * ) Notice: Subject to any disclaimer, the term of this patent is extended or adjusted under 35 U.S.C. 154(b) by 0 days.

(21) Appl. No.: 16/283,980

(22) Filed: Feb. 25, 2019

(51) Int. Cl.
G02B 6/06 (2006.01)
H05K 1/02 (2006.01)
F21V 8/00 (2006.01)

(52) U.S. Cl.
CPC ......... H05K 1/0274 (2013.01); G02B 6/0061 (2013.01); G02B 6/0065 (2013.01); G02B 6/0083 (2013.01); G02B 6/0091 (2013.01); *H05K 2201/10106* (2013.01)

(58) Field of Classification Search
CPC ....... H05K 1/0274; H05K 2201/10106; G02B 6/0061; G02B 6/0083; G02B 6/0091
USPC ............................................ 385/14; 362/235
See application file for complete search history.

(56) References Cited

U.S. PATENT DOCUMENTS

| | | | |
|---|---|---|---|
| 5,947,578 A | 9/1999 | Ayres | |
| 7,989,839 B2 * | 8/2011 | Dahm | A61C 19/003 257/276 |
| 8,723,146 B2 * | 5/2014 | Dahm | F21V 29/30 250/494.1 |
| 9,062,854 B2 * | 6/2015 | Livesay | F21V 29/505 |
| 9,869,810 B2 | 1/2018 | Keranen et al. | |
| 2005/0265029 A1 * | 12/2005 | Epstein | G02B 3/0056 362/339 |
| 2009/0296389 A1 * | 12/2009 | Hsu | G02F 1/133603 362/235 |
| 2011/0198026 A1 * | 8/2011 | Gourlay | G02B 6/0021 156/280 |
| 2011/0317417 A1 * | 12/2011 | Gourlay | G02B 6/0043 362/235 |
| 2012/0268963 A1 * | 10/2012 | Gourlay | G02B 6/0021 362/602 |
| 2013/0033901 A1 * | 2/2013 | Nishitani | G02B 6/0036 362/613 |

(Continued)

OTHER PUBLICATIONS

U.S. Appl. No. 16/109,196, First Named Inventor: Ron G. Gipson, "Light Guide Plate Providing Protection for Electronics Components of a Printed Circuit Board," filed Aug. 22, 2018.

*Primary Examiner* — Akm E Ullah
(74) *Attorney, Agent, or Firm* — Vivacqua Crane PLLC

(57) ABSTRACT

A component assembly includes a body having an electronics component mounted on a first face of the body. A light emitting diode is mounted on a first portion of the first face. A top plate is attached to the body and covers the light emitting diode and the electronics component. The top plate includes: a first cavity having the electronics component positioned within the first cavity; and a first support area homogeneously connected to the top plate and extending from the top plate to directly contact the body outside of the cavity to provide support for the top plate and to mitigate against collapse of the cavity.

20 Claims, 3 Drawing Sheets

(56) References Cited

U.S. PATENT DOCUMENTS

| | | | |
|---|---|---|---|
| 2016/0097894 A1* | 4/2016 | Kim | G02B 6/0065 |
| | | | 362/611 |
| 2019/0113674 A1* | 4/2019 | Gipson | B60K 35/00 |
| 2019/0196084 A1* | 6/2019 | Gipson | H05K 3/28 |
| 2019/0196085 A1* | 6/2019 | Gipson | G02B 6/0021 |

* cited by examiner

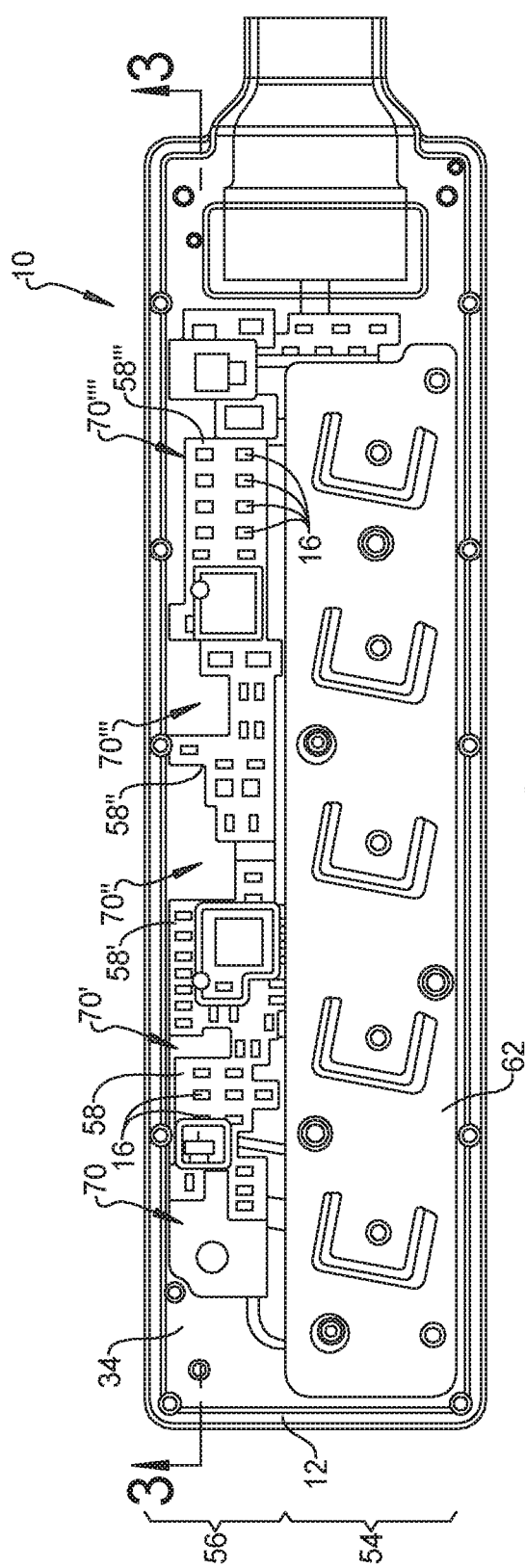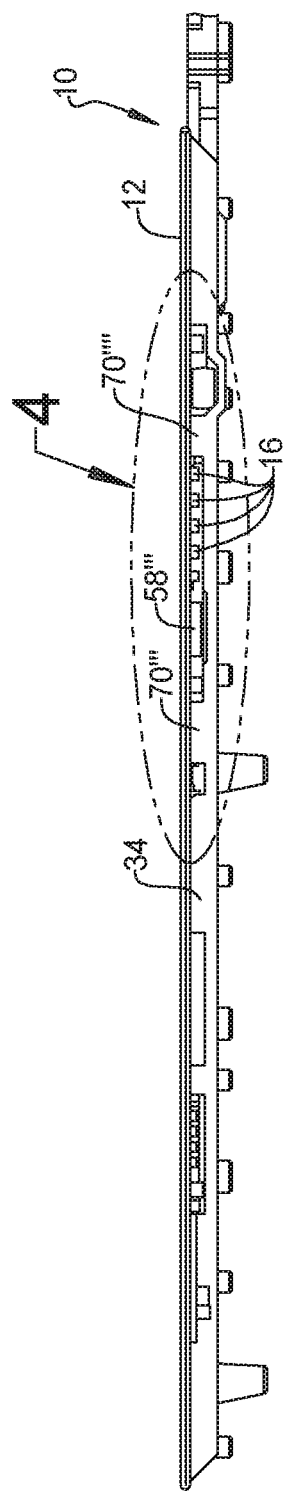

STRUCTURAL SUPPORT ELEMENTS OF LIGHT GUIDE AND ELECTRICAL HOUSING

FIELD

The present disclosure relates generally to printed circuit boards having at least one light generating component and a light guide.

BACKGROUND

The statements in this section merely provide background information related to the present disclosure and may or may not constitute prior art.

Electronic assemblies with backlit visual elements may be manufactured via several processes. Most commonly, a plastic part of a polymeric material resin is molded with some portion of the plastic being clear or translucent, with electronic components including one or more light sources attached mechanically to the part after molding, so that light is visible through the clear or translucent portion, resulting in a backlighting effect. More recently, methods have been developed of embedding one or more light sources in a molded plastic part. One such method is to encapsulate light sources and associated electronic components (collectively "package") in a clear resin via low-pressure molding and then to injection-mold plastic over or around the encapsulated package. The encapsulated package is thereby embedded in the plastic, with some portion of the plastic being clear or translucent so that light from the encapsulated package is visible through the clear or translucent plastic, resulting in a backlighting effect.

Another such method is to mount light sources and associated electronics ("packages") onto a polymer film, form the film into a desired shape, and then insert the formed film into an injection mold having substantially the same shape. A following step injection-molds plastic onto the film such that the package is embedded between the film on which it is mounted and the plastic that has been molded onto it, with portions of the film and/or plastic being clear or translucent such that light from the light sources is visible from the part exterior, resulting in a backlighting effect.

Certain open cavities providing space for components that are created during the injection molding operation such as electronics components have a ceiling formed of thin plastic to reduce weight and cost. The ceiling is designed protect the electrical components from mechanical forces that can cause failure to the electrical components or the components' solder points. Loading of the ceiling top plate can occur from hard mechanical forces or pressure such as during the injection molding operation which is detrimental to the components beneath the ceiling top plate.

Thus, while current cavity ceilings of printed film assemblies achieve their intended purpose, there is a need for a new and improved system and method for protecting printed film assemblies.

SUMMARY

According to several aspects, a component assembly includes a body having an electronics component mounted on a first portion of a first face of the body. A top plate covers the electronics component. The top plate includes: a cavity having the electronics component positioned within the cavity; and a first support area positioned outside of the cavity homogeneously connected to the top plate and extending from the top plate to directly contact the body, the first support area providing support for the top plate and mitigating against collapse of the cavity.

In another aspect of the present disclosure, the top plate includes a ceiling of the cavity positioned over the electronics component.

In another aspect of the present disclosure, the top plate is a molded polymeric material having a clearance gap provided in an as-molded condition of the top plate between the electronics component and the ceiling.

In another aspect of the present disclosure, the top plate defines a light guide molded of a light transmissive polymeric material and includes a second support area homogeneously connected to the top plate and extending from the top plate to directly contact the body outside of the cavity and positioned oppositely about the cavity with respect to the first support area to provide support for the top plate and to mitigate against collapse of the cavity.

In another aspect of the present disclosure, a first length of the first support area differs from a second length of the second support area inducing a curvature of the body when the top plate is mounted to the body.

In another aspect of the present disclosure, a light emitting diode is mounted on the first face of the body, and the top plate is molded of an optically clear polymeric material attached to the body and also covers the light emitting diode. The top plate is pre-molded and is separately attached to the body using multiple first pins homogeneously connected to the top plate which are individually received in one of multiple apertures created in the body.

In another aspect of the present disclosure, a reflector plate is positioned in direct contact with an outer surface of the top plate and is separately attached to the top plate using multiple second pins homogeneously connected to the top plate which are individually received in one of multiple apertures created in the reflector plate.

In another aspect of the present disclosure, the body defines a printed circuit board and the light emitting diode is mounted on a second portion of the first face separate from the first portion.

In another aspect of the present disclosure, the top plate defines a light transmissive polymeric material light guide attached to the second portion of the body.

In another aspect of the present disclosure, a molded outer layer of a substantially opaque polymeric material is applied to a second face of the body oppositely facing with respect to the top plate.

According to several aspects, a component assembly includes a body having an electronics component mounted on a first face of the body. A light emitting diode is mounted on a first portion of the first face. A top plate is attached to the body and covers the light emitting diode and the electronics component. The top plate includes: a first cavity having the electronics component positioned within the first cavity; and a first support area homogeneously connected to the top plate and extending from the top plate to directly contact the body outside of the cavity to provide support for the top plate and to mitigate against collapse of the cavity.

In another aspect of the present disclosure, the body includes a through aperture positioned proximate to the light emitting diode.

In another aspect of the present disclosure, the top plate defines a light guide made of a light transmissive polymeric material.

In another aspect of the present disclosure, the light guide includes a cavity defining a light outlet positioned over the light emitting diode and aligned with the through aperture positioned proximate to the light emitting diode.

In another aspect of the present disclosure, the top plate is pre-molded and is separately attached to the body using multiple first pins homogeneously connected to the top plate which are individually received in one of multiple apertures created in the body.

In another aspect of the present disclosure, a reflector plate is positioned in direct contact with an outer surface of the top plate and covers the light emitting diode but does not cover the electronics component.

In another aspect of the present disclosure, the reflector plate is separately attached to the top plate using second pins integrally connected to the top plate which are individually received in one of multiple apertures created in the reflector plate.

According to several aspects, a component assembly includes a printed circuit board having an electronics component mounted on a first face of the printed circuit board. A light emitting diode is mounted on a first portion of the first face. A light guide molded of a light transmissive polymeric material is connected to the printed circuit board and covers the light emitting diode and the electronics component. The light guide is attached using first pins extending from the light guide to the printed circuit board. The light guide includes: a cavity having the electronics component positioned within the cavity; and first and second support areas each homogeneously connected to the light guide and extending from the light guide to directly contact the first face of the printed circuit board. The first and second support areas are positioned oppositely about the cavity to provide support for the light guide and to mitigate against collapse of the cavity. A reflector plate molded of a polymeric material positioned on the light guide extends over the light emitting diode and is connected using second pins extending from the light guide to the reflector plate.

In another aspect of the present disclosure, the light guide includes a ceiling positioned over the electronics component, with a clearance gap provided between the electronics component and the ceiling.

In another aspect of the present disclosure, a first length of the first support area differs from a second length of the second support area inducing a curvature of the printed circuit board when the light guide is connected to the printed circuit board.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIG. 2 is a top plan view of the completed component assembly of FIG. 1;

FIG. 3 is a cross sectional side elevational view taken at section 3 of FIG. 2;

DETAILED DESCRIPTION

The following description is merely exemplary in nature and is not intended to limit the present disclosure, application, or uses.

Figure 1:
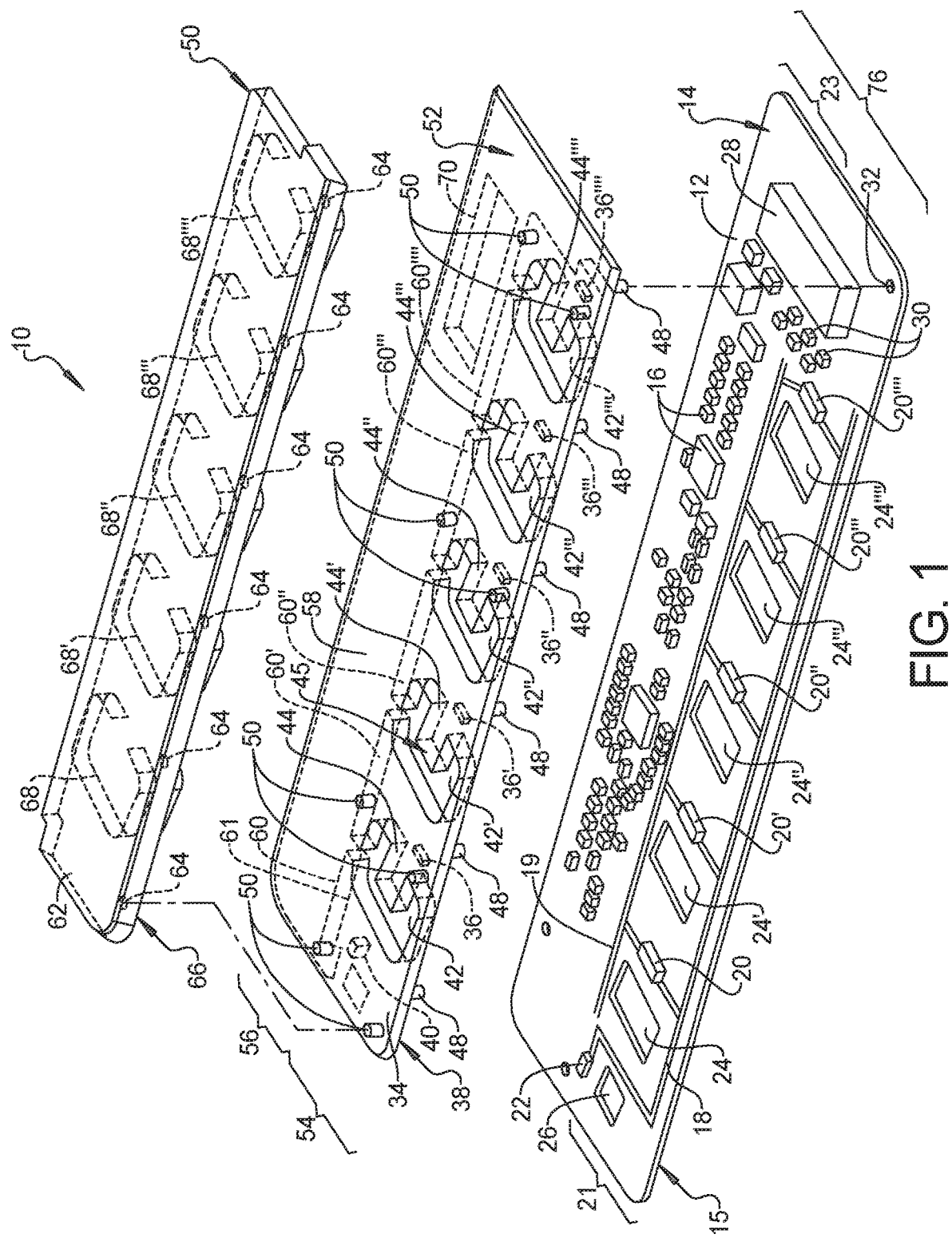
FIG. 1 is a perspective assembly view of a component assembly according to an exemplary embodiment.

Referring to FIG. 1, a laminated light guide and component carrier defining a component assembly 10 includes a body 12 such as a printed circuit board having multiple electronics components mounted thereon and which is flexible allowing the body 12 to conform to different shapes including substantially flat and curved. According to several aspects, the body 12 defines a rectangular shape, however any desired geometric shape may be used. The body 12 includes a first side or first face 14 and an oppositely directed second face 15. On the first face 14 of the body 12 are located multiple electronics components 16 including capacitors, which are electrically connected to a plurality of first electrical traces 18, 19 (only partially shown for clarity) printed for example by a screen printing process onto the first face 14.

Multiple light emitting diodes 20, 20', 20", 20''', 20'''' are also individually mounted on a first portion 21 of the first face 14 and are connected to the electrical traces 18, 19. An additional light emitting diode 22 can optionally be provided at one end of the first portion 21 of the first face 14 of the body 12 to provide an illuminated indication that electrical power is available for the component assembly 10. According to several aspects, the multiple electronics components 16 are disposed on a second portion 23 of the first face 14 of the body 12. According to several aspects, the light emitting diodes 20, 20', 20", 20''', 20'''' define side firing diodes, with visible light emitted from the light emitting diodes directed generally parallel to the first face 14.

Positioned proximate to each of the light emitting diodes 20, 20' are multiple individual through apertures 24, 24', 24", 24''', 24'''' created in the body 12. According to several aspects each of the through apertures 24, 24', 24", 24''', 24'''' are square or rectangular shaped, however any geometry can be selected. A separate through aperture 26 may also be provided proximate to the light emitting diode 22, which is similar to the through apertures 24, 24', 24", 24''', 24'''' in function, but may have a smaller cross section. Also positioned on the first face 14 of the body 12 is a connector 28 which is connected to the electrical traces 18, 19. Multiple capacitive touch film contacts 30 are provided proximate to a space envelope of the connector 28. Multiple through apertures 32 are provided through the body 12 which frictionally receive pins discussed below.

A top plate which according to several aspects defines a light guide 34 is molded from a single injection molding shot of an optically clear polymeric material such as polymethyl methacrylate (PMMA) which is transparent or translucent to allow light passage through the light guide 34. According to several aspects, the light guide 34 is pre-molded and is separately attached to the body 12 defining the printed circuit board as will be described in greater detail in reference to FIG. 2. Multiple light emitting diode receiving pockets 36, 36', 36", 36''', 36'''' are formed in the light guide 34 that open from a contact surface 38 defining a body facing side of the light guide 34. Each of the pockets 36, 36', 36", 36''', 36'''' is sized to receive and partially surround one of the light emitting diodes 20, 20', 20", 20''', 20'''' when the light guide 34 is press-fit onto the first face 14 of the body 12. A separate pocket 40 is also created in the light guide 34 which receives the light emitting diode 22.

Multiple generally U-shaped cavities defining light outlets 42, 42', 42", 42''', 42'''' are created through the light guide 34 each aligned with individual ones of the through apertures 24, 24', 24", 24''', 24'''' when the light guide 34 is press-fit onto the first face 14 of the body 12. Multiple light reflectors or light lenses 44, 44', 44", 44''', 44'''', co-molded of the PMMA material and homogeneously connected to the light guide 34 each extend into one of the light outlets 42. Each of the light lenses 44, 44', 44", 44"', 44"" includes a planar reflector surface 45 oriented substantially parallel to the contact surface 38. When the light guide 34 is positioned on the body 12 each of the light lenses 44, 44', 44", 44"', 44"" substantially overlaps one of the through apertures 24, 24', 24", 24"', 24"" with the light guide 34 press-fit onto pins described below extending from the first face 14 of the body 12. A separate light lens 46 also co-molded of the PMMA material and homogeneously connected to the light guide 34 overlaps the through aperture 26 when the light guide 34 is positioned on the body 12.

Multiple male projections defining first pins 48 co-molded of the PMMA material and homogeneously connected to the light guide 34 extend downwardly as viewed in FIG. 1 away from the contact surface 38 of the light guide 34. Each of the first pins 48 is frictionally received in one of the through apertures 32 formed in the body 12 when the light guide 34 is press-fit onto the first face 14 of the body 12. Multiple male projections defining second pins 50 co-molded of the PMMA material and homogeneously connected to the light guide 34 extend upwardly as viewed in FIG. 1 away from a top surface 52 of the light guide 34. The second pins 50 have common lengths and are aligned with apertures created in a reflector body 54 which is described in greater detail below.

The light outlets 42, 42', 42", 42"', 42"" and the light lenses 44, 44', 44", 44"', 44"" are positioned in a first portion 54 of the light guide 34. A second portion 56 of the light guide 34 extends over and therefore covers the remaining portion of the body 12 including over the electronics components 16. One or more partial cavities 58 are formed and extend upward from the contact surface 38 of the second portion 56 of the light guide 34 which individually provide space to receive at least an individual one of the electronics components 16 entirely within one of the partial cavities 58. The second portion 56 also includes one or more wall portions 60, 60', 60", 60"', 60"" extending therefrom that at least partially define an edge of the second portion 56. The wall portions 60, 60', 60", 60"', 60"" individually or collectively include a distal end 61 that contacts the body 12 and provide structural support for the light guide 34 where the light guide 34 is supported on the first face 14 of the body 12 along the edge of the second portion 56. The partial cavity 58, or cavities if multiple ones of the partial cavities 58 are used, are sized to provide clearance between material of the light guide 34 and the electronics components 16. According to several aspects, the partial cavity 58 is provided as multiple individual partial cavities each including one or more of the electronics components 16. Multiple areas of the light guide 34 within the second portion 56 but positioned outside of the partial cavities 58 are provided as structural support areas 70, 70', 70", 70"', 70"", only one of which is shown in FIG. 1 for clarity. The structural support areas 70, 70', 70", 70"', 70"" are described in greater detail in reference to FIG. 2.

A top plate 62 of a polymeric material such as an injected resin, PMMA material or a stamped film is molded using a molding process. The top plate 62 is sized to fit within a space envelope of the first portion 54 of the light guide 34. The top plate 62 is positioned on and in direct contact with the top surface 52 of the light guide 34 and includes multiple apertures 64 created in a bottom surface 66 which individually receive the second pins 50 of the light guide 34 to mechanically connect the top plate 62 to the light guide 34. The top plate 62 therefore follows a contour or shape of the light guide 34 and the body 12. According to several aspects, the top plate 58 is white in color to reflect visible light created when the light emitting diodes 20, 20', 20", 20"', 20"", 22 are energized which would otherwise escape through the light guide 34 and return the light back into the light guide 34.

The top plate 62 also includes multiple male U-shaped filler members 68, 68', 68", 68"', 68"" co-molded with and homogeneously extending from the lower surface 66 of the top plate 62. Each of the filler members 68, 68', 68", 68"', 68"" is sized to be slidably received in and to substantially fill one of the cavities defining the light outlets 42, 42', 42", 42"', 42"" created in the light guide 34 when the lower surface 66 is brought into direct contact with the top surface 52 of the light guide 34. The light outlets 42, 42', 42", 42"', 42"" created in the light guide 34 receive the filler members 68, 68', 68", 68"', 68"" which extend from the top plate 58 to add white reflective material of the top plate 62 directly into the light guide 34.

Referring to FIG. 2 and again to FIG. 1, a fully assembled component assembly 10 is shown having the light guide 34 installed onto the body 12 which covers substantially all of the first face 14 of the body 12 and is positioned above the light emitting diodes 20, 20', 20", 20"', 20"", 22, which are not visible in this view, and above the various electronics components 16. The top plate 62 is positioned over the first portion 54 on top of the light guide 34. According to several aspects, the partial cavity 58 of the light guide 34 is provided as multiple individual partial cavities 58, 58', 58", 58"', each sized to enclose and cover one or more of the electronics components 16. Multiple areas of the second portion 56 of the light guide 34 which are positioned outside of the partial cavities 58, 58', 58", 58"" are designated as the support areas 70, 70', 70", 70"', 70"". To provide additional support for the light guide 34 and to mitigate against collapse of any of the individual partial cavities 58, 58', 58", 58"" onto the electronics components 16 during the molding operation, each of the support areas 70, 70', 70", 70"', 70"" are homogeneously connected to the light guide 34 and extend downward as viewed in FIG. 2 to directly contact the first face 14 of the body 12 outside of the partial cavities 58, 58', 58", 58". The support areas 70, 70', 70", 70"', 70"" provide structural support in addition to the structural support provided by the wall portions 60, 60', 60", 60"', 60"" described above in reference to FIG. 1.

Referring to FIG. 3 and again to FIG. 2, an exemplary one of the partial cavities 58, the partial cavity 58"" is created during formation of the light guide 34 to provide an air gap clearance for the electronics components 16 positioned within the partial cavity 58". The support area 70"' is shown positioned to the left of the partial cavity 58"" as viewed in FIG. 3, and the support area 70"" is shown positioned to the right of the partial cavity 58". According to several aspects, a height or a length of the support areas 70, 70', 70", 70"', 70"" can differ between different ones of the support areas 70, 70', 70", 70"', 70"" thereby inducing a curvature of the body 12 as shown in FIG. 3 when the light guide 34 is connected to the body 12. For example, a first length of a first support area such as the centrally located support area 70"" is predetermined prior to the molding operation to be greater than or less than a second length of a second support area such as an outwardly positioned support area 70"".

Figure 4:
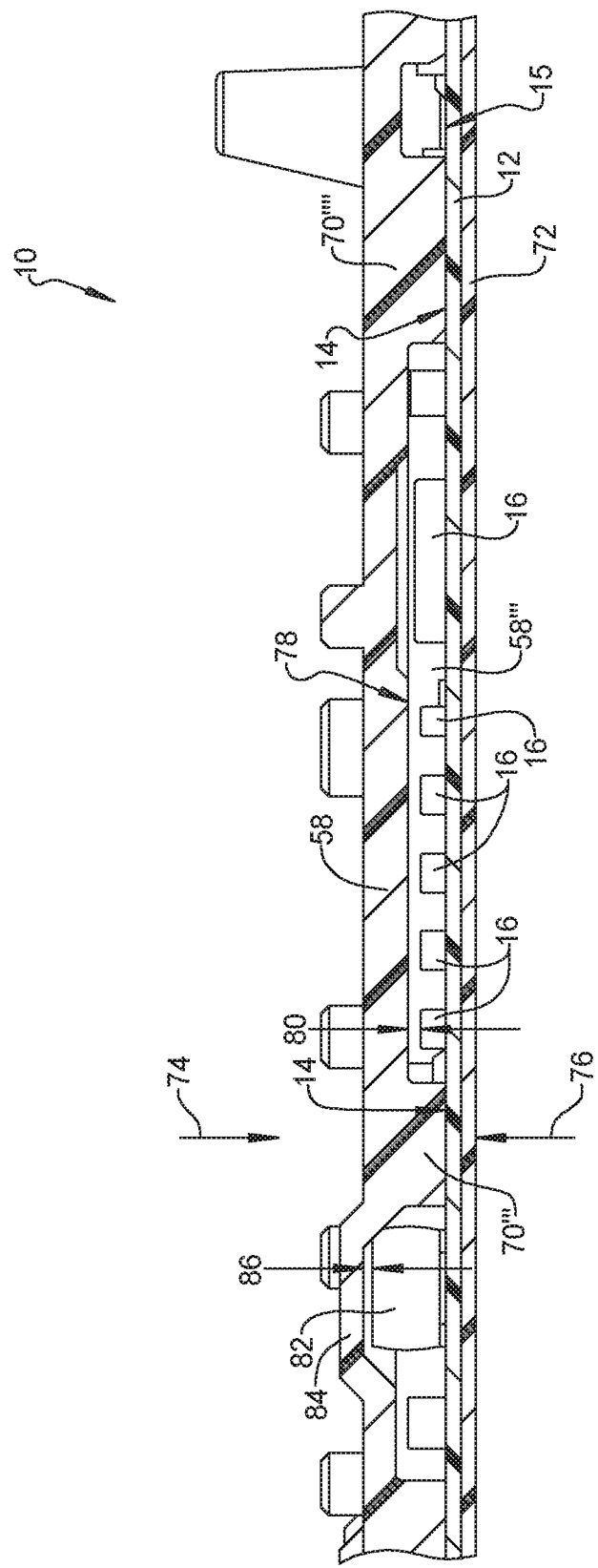
FIG. 4 is a cross sectional side elevational view of area 4 of FIG. 3.

Referring to FIG. 4 and again to FIGS. 1 through 3, the fully assembled component assembly 10 also includes a molded outer layer 72 of a polymeric material such as acrylonitrile butadiene styrene (ABS) applied to the second face 15 of the body 12 oppositely facing with respect to the light guide 34 and the top plate 62. According to several aspects, the molded outer layer 72 is substantially opaque, but may include sections positioned proximate to the light emitting diodes with designated insignia defining light transmissive portions created in the molded outer layer 72 back-illuminated when any one or all of the light emitting diodes are energized. A final finish layer (not shown) of a polymeric material such as PMMA may also be applied over the molded outer layer 72 to provide a durable finish coat. During a molding operation such as an injection molding operation to inject the material of the molded outer layer 72 a pressure force 74 acts toward the first face 14 and an opposed pressure force 76 acts toward the second face 15 of the body 12. Cavities such as the partial cavity 58′′′′ may be prone to partial collapse when these molding pressures are applied and as the parts cool. To mitigate against cavity ceiling collapse, the support area 70′′′ positioned to the left of the partial cavity 58′′′′ and the support area 70′′′′ positioned to the right of the partial cavity 58′′′′ provide exemplary structural reinforcement areas of the light guide 34. Each support area 70, 70′, 70′′, 70′′′, 70′′′′ defines a homogeneous, or integral extension of the polymeric material of the light guide 34. Each of the support areas 70, 70′, 70′′, 70′′′, 70′′′′ is positioned outside of at least one of the partial cavities 58, 58′, 58′′, 58′′′. For example the support area 70′′′ defines a first support area and the support area 70′′′′ defines a second support area homogeneously connected to the top plate 62 and extending from the top plate 62 to directly contact the body 12 outside of the cavity 58′′. The support area 70′′′′ is positioned oppositely about the cavity 58′′′′ with respect to the first support area 70′′′, defining opposed sides or side walls of the cavity 58′′′′ to provide support for the top plate 62 and to mitigate against collapse of the cavity 58′′.

Each of the support areas such as the support area 70′′′ directly contacts the first face 14 of the body 12 and therefore provides a load path for the pressure force 74 acting toward the first face 14 during the molding operation. The pressure force 74 acting toward the first face 14 is therefore more evenly distributed through the light guide 34, reducing the potential to collapse an inner wall or ceiling 78 of the partial cavity 58′′′ onto any of the electronics components 16 within the partial cavity 58′′. A clearance gap 80 or air gap is therefore provided between any of the electronic components 16 and the proximate ceiling of any of the partial cavities 58, 58′, 58′′, 58′′′. The clearance gap 80 also provides for clear passage or venting of air or gas outward from between components of the component assembly 10 during assembly as the components and polymeric materials cool from the molding temperatures.

Because some of the electronic components such as an electronic component 82 may be substantially larger or taller than others, a ceiling area 84 of the light guide 34 can be modified to accommodate the greater height or space envelope. A clearance gap 86 however is still maintained, similar to the clearance gap 80, between the ceiling area 84 and the electronic component 82, and the support areas such as the support area 70′′′ still act as a load path for any modified ceiling areas.

The support areas of the present disclosure are described above with reference to localized walls, however the support areas can have multiple different shapes. These include but are not limited to walls, posts, tab projections, local thickening of the light guide 34 and arching of the top plate 62. The features or support areas that project off the top plate 62 can have shapes that include: posts, walls, tab projections, local thickening of the top plate and arching of the top plate. Features that project off the top plate will project until they interface with a floor such as the first face 14 of the body 12.

The support areas of the present disclosure are also described above with reference to homogeneous or integral extensions of the light guide 34, however according to further aspects, the support areas can also be projected from the top plate 62 or from a modified light guide where space is available to extend the light guide over any or all of the electronics components 16.

A component assembly of the present disclosure offers several advantages. These include provision of a plate such as the light guide 34 that covers and protects the electronics components 16 within one or more cavities of the light guide 34 with the electronics components 16 mounted on the printed circuit board or body 12, by carrying loads such as molding pressure loads applied to the light guide 34 to the body 12 using a column and beam support for the light guide 34. These design features provide structural support for the light guide 34 when loading of the light guide 34 occurs. The addition of structural support columns or features will keep the polymeric material ceiling of the cavities from changing position and contacting the electronics components 16. The structural features are formed during the injection molding process and require no further components or labor to achieve protection of the electronics components 16.

The description of the present disclosure is merely exemplary in nature and variations that do not depart from the gist of the present disclosure are intended to be within the scope of the present disclosure. Such variations are not to be regarded as a departure from the spirit and scope of the present disclosure.

What is claimed is:

1. A component assembly, comprising:
 a body having an electronics component mounted on a first portion of a first face of the body; and
 a top plate covering the electronics component, the top plate having:
  a cavity having the electronics component positioned within the cavity; and
  a first support area positioned outside of the cavity homogeneously connected to the top plate and extending from the top plate to directly contact the body, the first support area providing support for the top plate and mitigating against collapse of the cavity.

2. The component assembly of claim 1, wherein the top plate includes a ceiling of the cavity positioned over the electronics component.

3. The component assembly of claim 2, wherein the top plate is a molded polymeric material having a clearance gap provided in an as-molded condition of the top plate between the electronics component and the ceiling.

4. The component assembly of claim 1, wherein the top plate defines a light guide molded of a light transmissive polymeric material and includes a second support area homogeneously connected to the top plate and extending from the top plate to directly contact the body outside of the cavity and positioned oppositely about the cavity with respect to the first support area to provide support for the top plate and to mitigate against collapse of the cavity.

5. The component assembly of claim 4, wherein a first length of the first support area differs from a second length of the second support area inducing a curvature of the body when the top plate is mounted to the body.

6. The component assembly of claim 1, further including:
 a light emitting diode mounted on the first face of the body; and the top plate is molded of an optically clear polymeric material attached to the body and also covers the light emitting diode;

wherein the top plate is pre-molded and is separately attached to the body using multiple first pins homogeneously connected to the top plate which are individually received in one of multiple apertures created in the body.

7. The component assembly of claim 6, further including a reflector plate positioned in direct contact with an outer surface of the top plate and separately attached to the top plate using multiple second pins homogeneously connected to the top plate which are individually received in one of multiple apertures created in the reflector plate.

8. The component assembly of claim 6, wherein the body defines a printed circuit board and the light emitting diode is mounted on a second portion of the first face separate from the first portion.

9. The component assembly of claim 8, wherein the top plate defines a light transmissive polymeric material light guide attached to the second portion of the body.

10. The component assembly of claim 1, further including a molded outer layer of a substantially opaque polymeric material applied to a second face of the body oppositely facing with respect to the top plate.

11. A component assembly, comprising:
a body having an electronics component mounted on a first face of the body;
a light emitting diode mounted on a first portion of the first face;
a top plate attached to the body and covering the light emitting diode and the electronics component, the top plate having:
a first cavity having the electronics component positioned within the first cavity; and
a first support area homogeneously connected to the top plate and extending from the top plate to directly contact the body outside of the first cavity to provide support for the top plate and to mitigate against collapse of the first cavity.

12. The component assembly of claim 11, wherein the body includes a through aperture positioned proximate to the light emitting diode.

13. The component assembly of claim 12, wherein the top plate defines a light guide made of a light transmissive polymeric material.

14. The component assembly of claim 13, wherein the light guide includes a second cavity defining a light outlet positioned over the light emitting diode and aligned with the through aperture positioned proximate to the light emitting diode.

15. The component assembly of claim 11, wherein the top plate is pre-molded and is separately attached to the body using multiple first pins homogeneously connected to the top plate which are individually received in one of multiple apertures created in the body.

16. The component assembly of claim 15, further including a reflector plate positioned in direct contact with an outer surface of the top plate, the reflector plate covering the light emitting diode and not covering the electronics component.

17. The component assembly of claim 16, wherein the reflector plate is separately attached to the top plate using second pins integrally connected to the top plate which are individually received in one of multiple apertures created in the reflector plate.

18. A component assembly, comprising:
a printed circuit board having an electronics component mounted on a first face of the printed circuit board;
a light emitting diode mounted on a first portion of the first face;
a light guide molded of a light transmissive polymeric material connected to the printed circuit board and covering the light emitting diode and the electronics component, the light guide attached using first pins extending from the light guide to the printed circuit board, the light guide having:
a cavity having the electronics component positioned within the cavity; and
first and second support areas homogeneously connected to the light guide and extending from the light guide to directly contact the first face of the printed circuit board, the first and second support areas positioned oppositely about the cavity to provide support for the light guide and to mitigate against collapse of the cavity; and
a reflector plate molded of a polymeric material positioned on the light guide and extending over the light emitting diode connected using second pins extending from the light guide to the reflector plate.

19. The component assembly of claim 18, wherein the light guide includes a ceiling positioned over the electronics component, with a clearance gap provided between the electronics component and the ceiling.

20. The component assembly of claim 18, wherein a first length of the first support area differs from a second length of the second support area inducing a curvature of the printed circuit board when the light guide is connected to the printed circuit board.

* * * * *